United States Patent [19]
Lee et al.

[11] Patent Number: 6,048,756
[45] Date of Patent: Apr. 11, 2000

[54] METHOD FOR MAKING A SILICON-ON-INSULATOR MOS TRANSISTOR USING A SELECTIVE SIGE EPITAXY

[75] Inventors: Jong Ho Lee, Ansan; Jong Son Lyu; Bo Woo Kim, both of Daejeon, all of Rep. of Korea

[73] Assignee: Electronics and Telecommunications Research Institute, Daejeon, Rep. of Korea

[21] Appl. No.: 09/104,203

[22] Filed: Jun. 25, 1998

[30] Foreign Application Priority Data

Jul. 31, 1997 [KR] Rep. of Korea ............ 97-36696

[51] Int. Cl.⁷ .............. H01L 21/00; H01L 21/8234; H01L 21/336; H01L 21/3205
[52] U.S. Cl. .............. 438/151; 438/225; 438/233; 438/297; 438/586
[58] Field of Search .................. 438/151, 297, 438/300, 305, 225, 233, 449, 453, 586

[56] References Cited

U.S. PATENT DOCUMENTS

| | | |
|---|---|---|
| 4,885,617 | 12/1989 | Mazure-Espejo et al. . |
| 4,899,202 | 2/1990 | Blake et al. . |
| 5,079,180 | 1/1992 | Rodder et al. ............ 437/44 |
| 5,095,348 | 3/1992 | Houston . |
| 5,116,771 | 5/1992 | Karulkar . |
| 5,160,989 | 11/1992 | Houston . |
| 5,198,378 | 3/1993 | Rodder et al. ............ 437/41 |
| 5,354,700 | 10/1994 | Haung et al. ............ 437/40 |
| 5,424,227 | 6/1995 | Dietrich et al. ............ 437/31 |
| 5,489,792 | 2/1996 | Hu et al. . |
| 5,583,059 | 12/1996 | Burghartz ............ 437/31 |
| 5,614,425 | 3/1997 | Kimura et al. ............ 437/31 |
| 5,616,508 | 4/1997 | Johnson et al. ............ 438/350 |
| 5,646,073 | 7/1997 | Grider et al. ............ 437/233 |
| 5,913,136 | 6/1999 | Deleonibus ............ 438/586 |

OTHER PUBLICATIONS

Yasuhiro Sato et al., "Characteristics of 1/4–$\mu$m Gate Ultrathin–Film Mosfets/Simox with Tungsten–Deposited Low–Resistance Source/Drain", Proceedings 1995 IEEE International SOI Conference, Oct. 1995, pp. 28–29.

Hua–Fang Wei et al., "Suppression of Parasitic Bipolar Effects and Off–State Leakage in Fully–Depleted SOI n–MOSFET's Using G–Implantation", IEEE Transactions on Electron Device, vol. 42, No. 12, Dec., 1995, pp. 2096–2102.

Terukazu Ohno et al., "Suppression of the Parasitic Bipolar Effect in Ultra–Thin–Film nMOSFETs/SIMOX by Ar Ion Implantation into Source/Drain Regions", 1995 IEEE, pp. 627–630.

Neal Kistler et al., "Detailed Characterization and Analysis of the Breakdown Voltage in Fully Depleted SOI n–Mosfet's", 1994 IEEE, pp. 1217–1221. (Month Unknown).

O. Faynot et al., "High Performance Ultrathin SOI MOSFET's Obtained by Localized Oxidation", 1994 IEEE, pp. 175–177 Month Unknown.

Mansun Chan et al., "Recessed–Channel Structure for Fabricating Ultrathin SOI MOSFET with Low Series Resistance", 1994 IEEE, pp. 22–24. Month Unknown.

*Primary Examiner*—John F. Niebling
*Assistant Examiner*—Michael S. Lebentritt
*Attorney, Agent, or Firm*—Jacobson, Price, Holman & Stern, PLLC

[57] ABSTRACT

Disclosed is a method for manufacturing a metal-oxide-semiconductor (MOS) device formed in an epitaxial silicon layer on insulator substrate comprising the steps of forming a field oxide layer defined an active region of the MOS device in the silicon layer and forming a gate oxide on the silicon layer; forming a gate electrode on the gate oxide, and self-aligned implanting a dopant of low concentration to form a lightly doped drain region; forming an oxide spacer in both sides of the gate electrode; growing a SiGe epitaxial layer having a lower bandgap than the silicon layer on the portion of the exposed silicon layer; and implanting a dopant of high concentration over the SiGe epitaxial layer to form a highly doped source/drain region. This invention can easily manufacture an SOI MOS device having a low source/drain series resistance and a high breakdown voltage without additional complex processes.

6 Claims, 2 Drawing Sheets

METHOD FOR MAKING A SILICON-ON-INSULATOR MOS TRANSISTOR USING A SELECTIVE SIGE EPITAXY

BACKGROUND OF THE INVENTION

1. Field of the Invention

The present invention relates generally to semiconductor devices, and more particularly to field effect devices fabricated in silicon-on-insulator (SOI) structure.

2. Description of the Related Art

Silicon-on-insulator (SOI) technology employs a layer of semiconductor material overlying an insulator layer on a supporting bulk wafer. Fully depleted SOI metal oxide semiconductor (MOS) transistors are attractive candidates for use in very large scale integrated (VLSI) circuits, due to numerous advantages over bulk silicon and thick-film (partially depleted) SOI devices. The reported improvements include reduced short-channel effects, improved sub-threshold slope, and higher transconductance.

However, these SOI MOS transistors suffer from several problems. One problem is floating body effects in channel of the field effect transistor. This deficiency is the main barrier to building high density, high speed SOI circuits using submicron MOS devices.

Another significant problem in thin SOI device design is lowering the breakdown voltage compared to bulk transistors. The early breakdown is a result of the feedback between the hole current and the parasitic lateral bipolar transistor. The breakdown voltage becomes very sensitive to variations in the silicon film thickness, that is, the breakdown voltage decreases as the film thickness is decreased. Additionally, the reduction of the silicon film thickness in SOI MOS transistor gives rise to high source/drain series resistance, which in turn lowers the device operation speed.

In an effort to avoid aforementioned problems, numerous researches have been reported. Problems due to the floating body effect and the low breakdown voltage can be solved by providing a contact to the body for hole current collection. However, the currently available hole collection schemes is very inefficient and consume significant amounts of device area. Also, a dual source structure using the implantation of germanium into the SOI device channel to suppress parasitic bipolar effects has been proposed, which is sensitive to process variations.

One solution to the source/drain series resistance problem is to selectively reduce the silicon film thickness over the channel region. However, the resulting recessed region and the polysilicon gate are not automatically aligned. To allow for the possible misalignment, the recessed thin silicon region must be made longer than the gate. This reduces the device performance and density, and results in asymmetrical devices. Silicidation can help improve the series resistance, but it will create mechanical stress and the process is hard to control on thin film silicon.

Ultimately, the conventional SOI MOS technologies are disadvantageous in that high breakdown voltage cannot coexist with low source/drain resistance.

SUMMARY OF THE INVENTION

It is therefore an object of the present invention to provide an improved method for manufacturing a silicon-on-insulator MOS device having a low source/drain series resistance and a high breakdown voltage.

According to a preferred embodiment of this invention, there is provided a method for manufacturing a metal-oxide-semiconductor (MOS) device formed in an epitaxial silicon layer on insulator substrate comprising the steps of:

forming a field oxide layer defined an active region of the MOS device in the silicon layer and forming a gate oxide on the silicon layer; forming a gate electrode on the gate oxide, and self-aligned implanting a dopant of low concentration to form a lightly doped drain region; forming an oxide spacer in both sides of the gate electrode; growing a SiGe epitaxial layer having a lower bandgap than the silicon layer only on the portion of the exposed silicon layer by a selective epitaxial growing method; implanting a dopant of high concentration over the SiGe epitaxial layer to form a highly doped source/drain region; depositing an interlayer dielectric film and forming openings in the interlayer dielectric film; and forming contacts in said openings.

Preferably, this embodiment is further comprising the step of thinning the exposed silicon layer after the step of forming the oxide spacer, and the thickness of said remained silicon layer is thinner than that of the silicon body contact region underlying the gate oxide.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings are only for the purpose of illustrating a preferred embodiment of the invention and are not to be construed as limiting the invention.

DESCRIPTION OF THE PREFERRED EMBODIMENTS

Referring now to FIGS. 1A–1F, a preferred embodiment of this invention will be described in detail. It should be noted that in all embodiments, the preferred substrate starting structure is an SOI wafer.

Figure 1A:
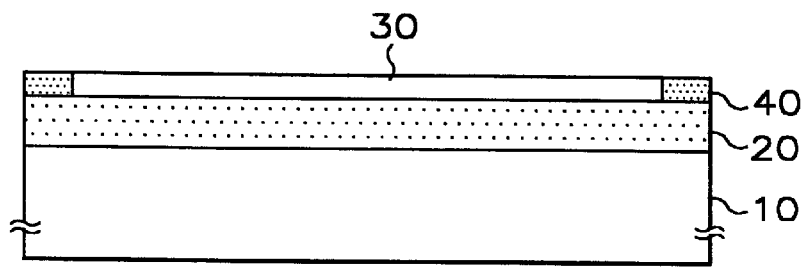
FIGS. 1A–1F are schematic cross-sectional process flow diagrams illustrating the major steps in processing an SOI substrate to fabricate a MOS device in accordance with the present invention.

As shown in FIG. 1A, the wafer is to form a good quality and very thin epitaxial film of silicon 30 on a buried oxide layer 20 supported by a bulk silicon substrate 10. Nest, a field oxide layer 40 is grown locally by the local oxidation (LOCOS) process.

Figure 1B:
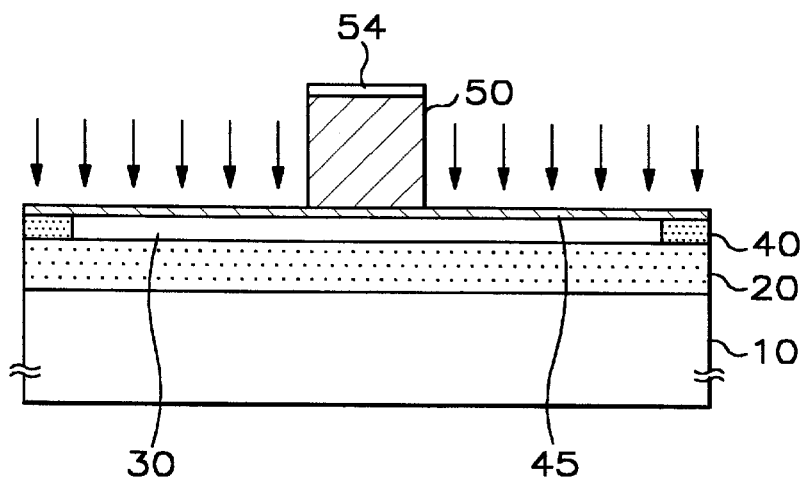

Referring to FIG. 1B, on an active region defined by the field oxide layer 40, a gate insulating layer 45 is grown. Then an undoped polysilicon film is deposited to form a gate electrode and an insulating layer 54 is subsequently deposited on the polysilicon film, for the purpose of isolating the gate electrode. The gate electrode 50 is formed by etching the insulating layer, followed by a self-aligned arsenic implant to form a lightly-doped drain (LDD) region.

Figure 1C:
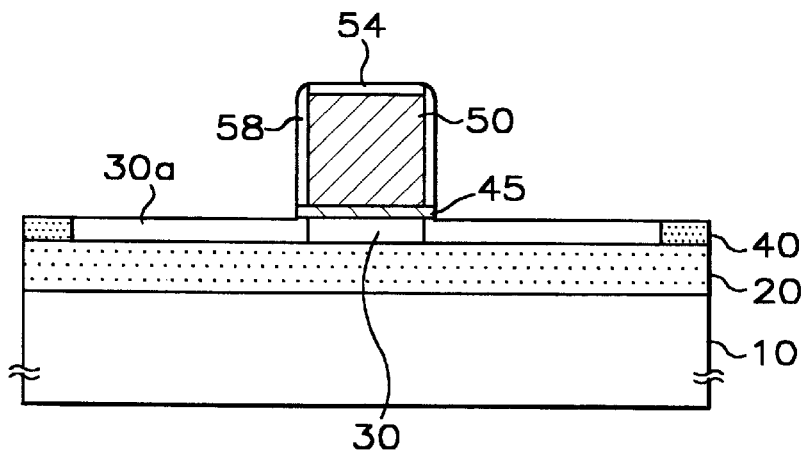

After the source/drain implant anneal to form an LDD region 30a, as shown in FIG. 1C, an oxide film is formed by a chemical vapor deposition method or thermal oxidation, and anisotropically etched to form an oxide spacer 58 at both sides of the gate electrode 50.

At this time, the gate oxide 45 on the source/drain region is etched to expose the LDD region of silicon 30a. Because the thickness of the oxide spacer 58 is closely related to the parasitic bipolar junction, the steps of depositing an oxide film and etching the oxide film to expose the silicon layer and to form the oxide spacer 58, is carried out at least two times for the purpose of exactly controlling the thickness of the spacer 58.

Figure 1D:
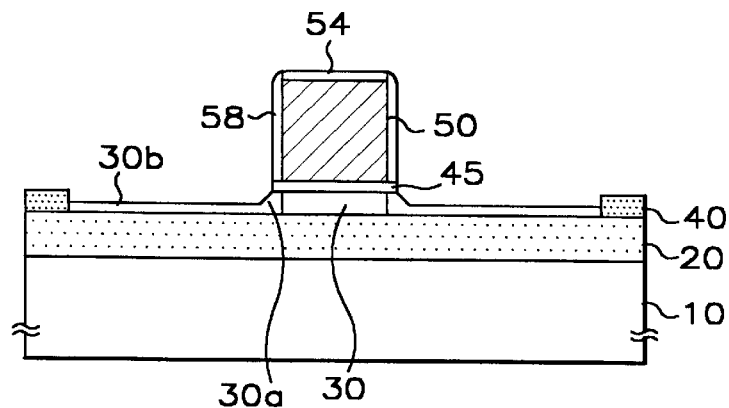

Next, FIG. 1D is showing the step of thinning the exposed silicon layer 30a so as to enhance the breakdown voltage of device. More specifically, the exposed silicon layer 30a is selectively etched. The reference numeral 30b is indicated remained silicon layer. At this time, the thickness of the remained silicon layer 30b is thinner than that of the body contact region of silicon 30 underlying the gate oxide 45. In FIG. 1D, reference numeral 30 indicates body contact of silicon, reference numeral 30a indicates LDD region, and 30b indicates the remained silicon epitaxial layer.

Figure 1E:
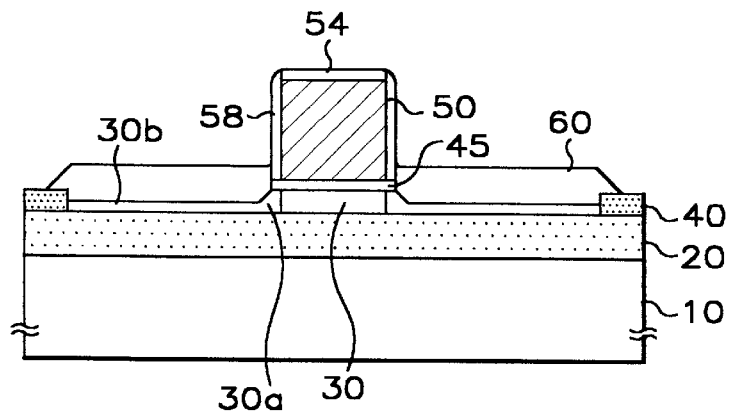

FIG. 1E is illustrating the step of growing a SiGe epitaxial layer 60 having a lower bandgap than the silicon layer. The SeiGe epitaxial layer 60 is grown by a selective epitaxial growing method on the portion of the exposed silicon layer 30b. By controlling the thickness of the SiGe epitaxial layer 60, the source/drain series resistance can be easily decreased, and the breakdown voltage lowering can be prevented.

Also, the mole fraction in the SiGe epitaxial layer 60 is closely connection with the parasitic bipolar junction, therefore, the mole fraction of germanium is determined in the range of 1–80% Additionally, instead of said SiGe epitaxial layer 60, a polysilicon layer including germanium can be used.

Then, not shown in the drawing, a dopant of high concentration is implanted in-situ over the SiGe epitaxial layer 60. After the self-aligned implant, annealing process is performed so as to form a highly doped source/drain region.

Figure 1F:
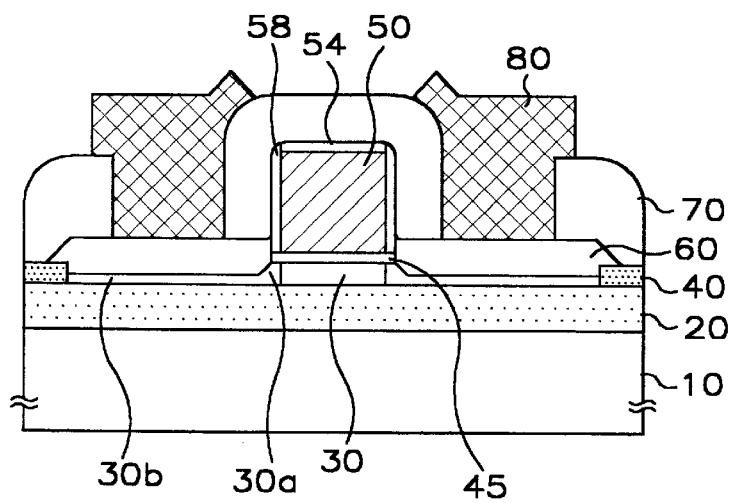

FIG. 1F is showing the final step of forming a metal interconnection 80. More particularly, an interlayer dielectric film 70 is deposited. Then, the interlayer dielectric film 70 is patterned by photolithography and etch techniques to obtain openings in the interlayer dielectric film 70. Finally, a metal electrode 80 is filled in said openings.

According to the preferred embodiments of the present invention, the aforementioned process allows fabrication of high speed, submicron SOI MOS devices without additional complex processes.

Also, this invention can easily manufacture an SOI MOS device having a low source/drain series resistance and a high breakdown voltage. In other words, the present invention has advantageous in that high breakdown voltage can coexist with low source/drain resistance.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for manufacturing a metal-oxide-semiconductor (MOS) device formed in an epitaxial silicon layer on insulator substrate comprising the steps of:

a) forming a field oxide layer defined an active region of the MOS device in the silicon layer and forming a gate oxide on the silicon layer;

b) forming a gate electrode on the gate oxide, and self-aligned implanting a dopant of low concentration to form a lightly doped drain region;

c) forming an oxide spacer in both sides of the gate electrode;

d) growing a SiGe epitaxial layer having a lower bandgap than the silicon layer only on the portion of the exposed silicon layer by a selective epitaxial growing method;

e) implanting a dopant of high concentration over the SiGe epitaxial layer to form a highly doped source/drain region;

f) depositing an interlayer dielectric film and forming openings in the interlayer dielectric film; and g) forming contacts in said openings.

2. The method as claimed in claim 1, wherein a polysilicon layer including germanium is used instead of said SiGe epitaxial layer.

3. The method as claimed in claim 1, further comprising the step of thinning the exposed silicon layer by etching after the step of (c).

4. The method of as claimed in claim 3, wherein the thickness of said remained silicon layer is thinner than that of the silicon body contact region underlying the gate oxide.

5. The method of as claimed in claim 1, wherein the mole fraction of germanium in said SiGe epitaxial layer is in the range of 1–80%.

6. The method of as claimed in claim 1, wherein the step of (c) including the steps of depositing an oxide film and etching over the oxide film to expose the silicon layer and to form the oxide spacer, carried out at least two times for the purpose of controlling the thickness of the spacer.

* * * * *